(12) United States Patent
Kim et al.

(10) Patent No.: US 11,171,073 B2
(45) Date of Patent: Nov. 9, 2021

(54) SWITCHING SEMICONDUCTOR DEVICE AND COOLING APPARATUS THEREOF

(71) Applicant: LG Magna e-Powertrain Co., Ltd., Incheon (KR)

(72) Inventors: Kyeonghwan Kim, Seoul (KR); Junho Ahn, Seoul (KR)

(73) Assignee: LG Electronics Inc., Seoul (KR)

( * ) Notice: Subject to any disclaimer, the term of this patent is extended or adjusted under 35 U.S.C. 154(b) by 0 days.

(21) Appl. No.: 16/704,466

(22) Filed: Dec. 5, 2019

(65) Prior Publication Data

US 2020/0235030 A1    Jul. 23, 2020

(30) Foreign Application Priority Data

Jan. 22, 2019   (KR) .................. 10-2019-0008277

(51) Int. Cl.
*H01L 23/367*   (2006.01)
*H01L 23/40*    (2006.01)
*H01L 23/473*   (2006.01)

(52) U.S. Cl.
CPC .......... *H01L 23/3672* (2013.01); *H01L 23/40* (2013.01); *H01L 23/473* (2013.01)

(58) Field of Classification Search
CPC .... H01L 23/3672; H01L 23/40; H01L 23/473
See application file for complete search history.

(56) References Cited

U.S. PATENT DOCUMENTS

| 5,705,850 A | * | 1/1998 | Ashiwake | ........... H01L 23/4338 257/706 |
| 5,774,334 A | * | 6/1998 | Kawamura | ......... H01L 23/4338 165/80.4 |
| 6,114,761 A | * | 9/2000 | Mertol | .................. H01L 23/367 257/722 |

(Continued)

FOREIGN PATENT DOCUMENTS

DE   102015212722 A1   1/2017
EP      2040293 A1      3/2009

(Continued)

OTHER PUBLICATIONS

Machine English Translation of JP 2013165122, Takechi et al., published Aug. 22, 2013.*

(Continued)

*Primary Examiner* — Peniel M Gumedzoe
(74) *Attorney, Agent, or Firm* — Finnegan, Henderson, Farabow, Garrett & Dunner LLP

(57) ABSTRACT

The present disclosure relates to a switching semiconductor device and a cooling apparatus thereof. The cooling apparatus of the switching semiconductor device of the present disclosure comprises a first heat dissipation plate configured to facilitate heat dissipation of a surface of the semiconductor device at an installation space, and a second heat dissipation plate disposed inside the installation space along a thickness direction of the first heat dissipation plate. The installation space is formed in a predetermined size at the surface of the semiconductor device, and the second heat (Continued)

dissipation plate is configured to contact the first heat dissipation plate so as to allow heat exchange. Accordingly, a heat dissipation area may be increased without increasing a size of the installation space.

17 Claims, 15 Drawing Sheets

(56) References Cited

U.S. PATENT DOCUMENTS

| | | | |
|---|---|---|---|
| 6,367,543 B1 | 4/2002 | Calaman et al. | |
| 2003/0016499 A1* | 1/2003 | Tanaka | H05K 7/20309 |
| | | | 361/700 |
| 2007/0246204 A1 | 10/2007 | Lai et al. | |
| 2010/0090336 A1* | 4/2010 | Yoshida | H01L 23/473 |
| | | | 257/717 |
| 2014/0069615 A1* | 3/2014 | Kusaka | H01L 23/473 |
| | | | 165/104.19 |
| 2019/0295919 A1* | 9/2019 | Sanda | H01L 21/565 |

FOREIGN PATENT DOCUMENTS

| | | |
|---|---|---|
| JP | 2015-079819 A | 4/2015 |
| WO | WO 2005/080902 A | 9/2005 |

OTHER PUBLICATIONS

Extended European Search Report in European Patent Application No. 19210274.7, dated Jun. 18, 2020 (9 pages).

* cited by examiner

SWITCHING SEMICONDUCTOR DEVICE AND COOLING APPARATUS THEREOF

CROSS-REFERENCE TO RELATED APPLICATIONS

This application claims the benefit of priority to Korean Patent Application No. 10-2019-0008277, filed on Jan. 22, 2019, the disclosure of which is hereby incorporated by reference in its entirety.

BACKGROUND

1. Technical Field

The present disclosure relates to a switching semiconductor device and a cooling apparatus thereof.

2. Background of the Present Disclosure

As is well known, a semiconductor device is a device constituting an electronic circuit made of a semiconductor material.

A so-called switching semiconductor device having an opening and closing function of a circuit without using a contact among the semiconductor devices generates a relatively large amount of heat during driving.

Such a switching semiconductor device is provided with a cooling apparatus for cooling down.

In particular, a part of a semiconductor device for high power switching may be integrally provided with a fin structure (heat dissipation plate) on a surface thereof for heat dissipation.

Another part of the semiconductor device for high power switching is implemented in a so-called flat plate type in which a fin structure for cooling down is not provided on a surface thereof.

A flat plate type fin structure (heat dissipation plate) for cooling down may be attached to the flat plate type switching semiconductor device.

Meanwhile, a cooling flow path is formed such that the heat dissipation plate and cooling fluid (cooling water) are in contact with each other in order to cool down the switching semiconductor device. The cooling flow path is provided with a cooling unit capable of cooling down the cooling fluid (cooling water) in order to lower a temperature of the cooling fluid in contact with the heat dissipation plate.

However, in such a conventional cooling apparatus of a switching semiconductor device, a flat plate type fin structure (heat dissipation plate) is attached on a flat plate type surface for cooling down the switching semiconductor device. As such, there is a problem that heat dissipation performance is limited due to an increase in thermal resistance as compared with an integrated heat dissipation fin structure.

In addition, in such a conventional cooling apparatus of a switching semiconductor device, in order to increase cooling performance, since sizes (volumes) of the heat dissipation plate and the cooling flow path in contact with the heat dissipation plate should be increased simultaneously, there is a problem that installation is restricted.

Further, since the size and structure of parts that form the flow path of the cooling fluid in contact with the heat dissipation plate should be changed, there is a problem in that additional costs are incurred due to changes in the size and structure of the parts forming the flow path of the cooling fluid.

SUMMARY

Therefore, the present disclosure is directed to providing a switching semiconductor device capable of increasing a heat dissipation area without increasing a size of an installation space of a cooling apparatus, and a cooling apparatus thereof.

In addition, the present disclosure is directed to providing a switching semiconductor device capable of increasing cooling performance without increasing a size of a flow path of cooling fluid, and a cooling apparatus thereof.

Further, the present disclosure is directed to providing a switching semiconductor device capable of suppressing an occurrence of additional costs due to a change of components since a structure of the components forming a flow path of cooling fluid is not changed, and a cooling apparatus thereof.

Furthermore, the present disclosure is directed to providing a switching semiconductor device capable of reducing the size of an installation space of a cooling apparatus while maintaining the same cooling performance to enable a compact configuration, and a cooling apparatus thereof.

In order to achieve the object as described above, the present disclosure provides a cooling apparatus of a switching semiconductor device may comprise a first heat dissipation plate configured to facilitate heat dissipation of a surface of the semiconductor device at an installation space, wherein the installation space may be formed in a predetermined size at the surface of the semiconductor device. The cooling apparatus may comprise a second heat dissipation plate disposed inside the installation space along a thickness direction of the first heat dissipation plate, and the second heat dissipation plate may be configured to contact the first heat dissipation plate so as to allow heat exchange.

According to one embodiment of the present disclosure, the first heat dissipation plate may be coupled to the surface of the semiconductor device so as to allow heat exchange.

According to one embodiment of the present disclosure, the first heat dissipation plate may comprise a plate-shaped first body; and a first heat dissipation fin protruding from a surface of the plate-shaped first body in a thickness direction, and the installation space may extend from the surface of the semiconductor device to an end portion of the first heat dissipation fin along the thickness direction of the first body.

According to one embodiment of the present disclosure, the second heat dissipation plate may comprise a plate-shaped second body comprising a first heat dissipation fin hole. The first heat dissipation fin may be inserted into the first heat dissipation hole.

According to one embodiment of the present disclosure, the second body may be spaced apart from the first body.

According to one embodiment of the present disclosure, the second heat dissipation plate may further comprise a second heat dissipation fin protruding from the plate-shaped second body.

According to one embodiment of the present disclosure, the second heat dissipation fin may be provided at both plate surfaces of the second body, respectively.

A second heat dissipation fin hole may be formed through the second body so as to couple the second heat dissipation fin to the plate-shaped second body.

According to one embodiment of the present disclosure, the second heat dissipation fin may be disposed on an extension line of one side of the first heat dissipation fin.

According to one embodiment of the present disclosure, the second heat dissipation plate may comprise an extension portion configured to increase a surface area of the second heat dissipation fin.

According to one embodiment of the present disclosure, the second heat dissipation fin may comprise a first heat dissipation plate contact portion in contact with the first heat dissipation plate.

According to one embodiment of the present disclosure, the first heat dissipation fin hole may comprise a contact section configured to contact with the first heat dissipation fin and a separation section spaced apart from the first heat dissipation fin.

According to one embodiment of the present disclosure, the first heat dissipation fin and the second body may be press-fitted into each other.

According to one embodiment of the present disclosure, the cooling apparatus may comprise a base member coupled to form a cooling fluid accommodation space between the base member and the first heat dissipation plate, and the first heat dissipation plate may be configured to be inserted into the base member. The second heat dissipation plate may be disposed between the first heat dissipation plate and the base member, and the second heat dissipation plate may be pressurized by the base member and coupled to the first heat dissipation plate when the first heat dissipation plate and the base member are coupled to each other.

According to one embodiment of the present disclosure, a cross-sectional area of the first heat dissipation fin may decrease along a protruding direction.

According to one embodiment of the present disclosure, both side portions of the first heat dissipation fin may be configured to converge to one side along a plate surface direction of the plate-shaped first body.

According to one embodiment of the present disclosure, both end portions of the first heat dissipation fin may be curved.

According to one embodiment of the present disclosure, the cooling apparatus may comprise a third heat dissipation plate coupled to the first heat dissipation plate or the second heat dissipation plate inside the installation space.

According to one embodiment of the present disclosure, the third heat dissipation plate may comprise a plate-shaped third body, and a coupling hole formed through the plate-shaped third body.

According to one embodiment of the present disclosure, the third heat dissipation plate further comprise a third heat dissipation fin protruding from the third body.

According to one embodiment of the present disclosure, the third heat dissipation plate may be parallel to the surface of the semiconductor device.

Meanwhile, according to another field of the present disclosure, a switching semiconductor device is provided, which may comprise a semiconductor device, a first heat dissipation plate configured to facilitate heat dissipation of a surface of the semiconductor device at an installation space, and a second heat dissipation plate disposed inside the installation space along a thickness direction of the first heat dissipation plate. The installation space may be formed in a predetermined size at the surface of the semiconductor device, and the second heat dissipation plate may be configured to contact the first heat dissipation plate so as to allow heat exchange.

According to one embodiment of the present disclosure, the second heat dissipation plate may comprise a second body coupled to the first heat dissipation plate and a second heat dissipation fin protruding from the second body.

In addition, according to another field of the present disclosure, a switching semiconductor device is provided, which may comprise a semiconductor device, a first heat dissipation plate provided so as to facilitate heat dissipation of a surface of the semiconductor device at an installation space, a second heat dissipation plate disposed inside the installation space along a thickness direction of the first heat dissipation plate, and a third heat dissipation plate disposed inside the installation space along the thickness direction of the first heat dissipation plate. The installation space may be formed in a predetermined size at the surface of the semiconductor device, the second heat dissipation plate may be configured to contact the first heat dissipation plate so as to allow heat exchange, and the third heat dissipation plate may be configured to contact the second heat dissipation plate so as to allow heat exchange.

According to one embodiment of the present disclosure, the third heat dissipation plate comprise a third body coupled to the second heat dissipation plate and a third heat dissipation fin protruding from the third body along a plate surface direction of the third body.

As described above, according to one embodiment of the present disclosure, a first heat dissipation plate disposed at a surface of a semiconductor device so as to exchange heat inside an installation space of a predetermined size at the surface of the semiconductor device, and a second heat dissipation plate disposed so as to exchange heat along a thickness direction of the first heat dissipation plate may be included, and thus a heat dissipation area of the semiconductor device can be increased without increasing a size of the installation space.

In addition, since it is not necessary to change a size and structure of a base member to which the first heat dissipation plate is coupled and which forms an accommodation space of cooling fluid between the base member and the first heat dissipation plate, an additional cost due to the change of the base member may be suppressed.

Further, the first heat dissipation plate and the second heat dissipation plate may be configured to be press-fitted to each other, so that heat transferring of the first heat dissipation plate and the second heat dissipation plate may be facilitated, and thus cooling effect can be enhanced.

Furthermore, a third heat dissipation plate coupled to the first heat dissipation plate or the second heat dissipation plate may be further included, and thus the heat dissipation area of the semiconductor device can be increased without increasing the installation area.

In addition, a third heat dissipation fin of the third heat dissipation plate may be disposed in parallel with the surface of the semiconductor device, and thus the heat dissipation area can be increased without greatly increasing flow resistance of the cooling fluid.

Further, a second heat dissipation fin of the second heat dissipation plate includes a first heat dissipation plate contacting portion in contact with the first heat dissipation plate, and thus a heat transfer between the first heat dissipation plate and the second heat dissipation plate may be facilitated.

Furthermore, the second heat dissipation plate may be disposed at a relatively low temperature region spaced far from the semiconductor device, which is a heat generating source, and thus heat exchange efficiency of the second heat dissipation plate can be improved.

In addition, the second heat dissipation plate may be disposed at a relatively low temperature region spaced far from the semiconductor device, which is a heat generating source and the third heat dissipation plate may be disposed at a low temperature region spaced further away therefrom, and thus heat exchange efficiency of the cooling fluid can be further improved.

Further, the heat exchange efficiency of the cooling fluid and the cooling apparatus (the first heat dissipation plate, the second heat dissipation plate and the third heat dissipation plate) may be improved by disposing more thermal conductors at a region spaced far from the semiconductor device, which is a heat generating source, so that, when the same cooling performance is maintained, a size of the cooling apparatus (the first heat dissipation plate, the second heat dissipation plate, and the third heat dissipation plate) may be reduced, and thus a compact configuration is enabled.

DETAILED DESCRIPTION

Figure 1:
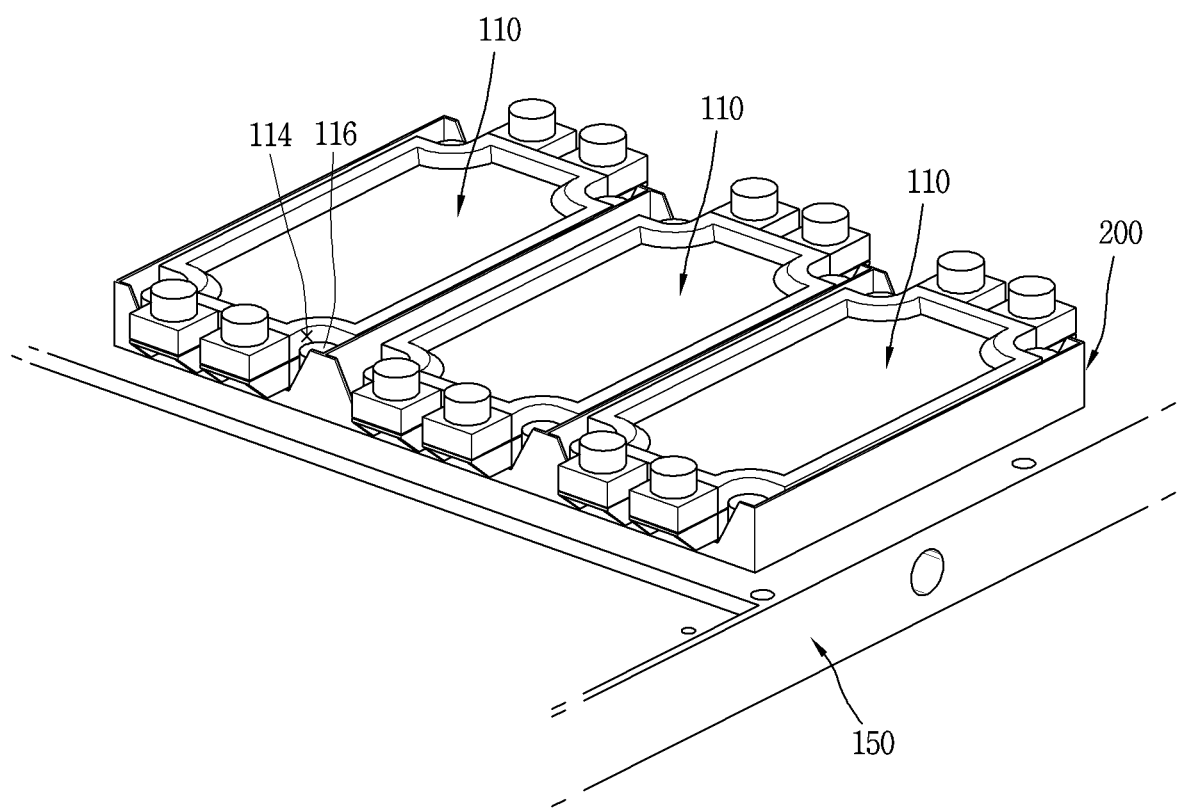
FIG. 1 is a view illustrating a switching semiconductor device according to an embodiment of the present disclosure.

Hereinafter, embodiments of the present disclosure will be described in detail with reference to the accompanying drawings. Herein, like reference numerals denote like elements even in different embodiments, and a description for an element appearing first will replace descriptions for like elements appearing later. As used herein, the singular forms "a," "an," and "the" are intended to include the plural forms as well unless the context clearly indicates otherwise. In describing embodiments disclosed in the specification, moreover, the detailed description will be omitted when a specific description for publicly known technologies to which the disclosure pertains is judged to obscure the gist of the embodiments disclosed in the specification. Also, it should be noted that the accompanying drawings are merely illustrated to easily understand the embodiments disclosed in the specification, and therefore, they should not be construed to limit the technical spirit disclosed in the specification.

Figure 2:
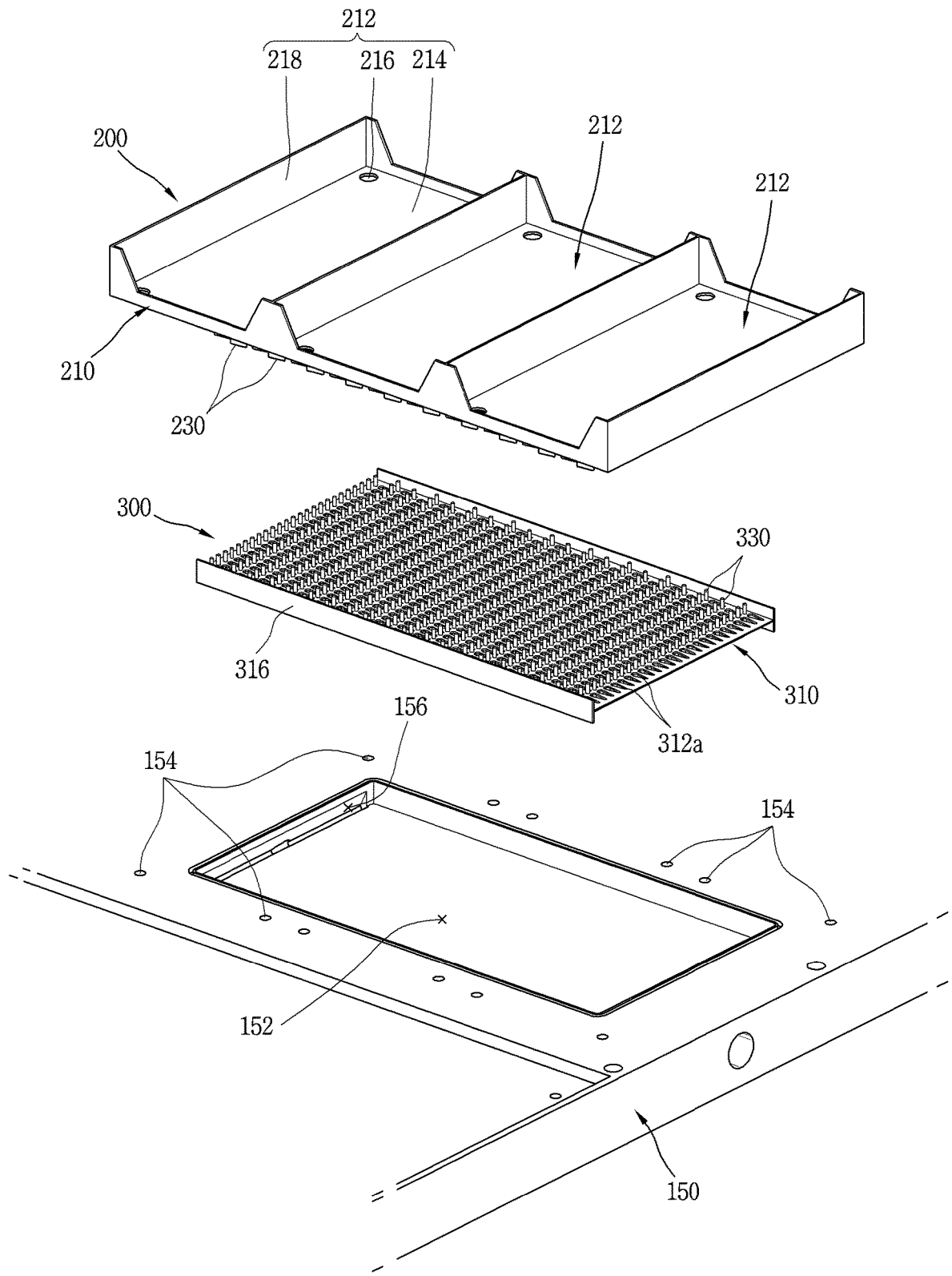
FIG. 2 is an exploded perspective view of FIG. 1.

FIG. 1 is a view illustrating a switching semiconductor device according to an embodiment of the present disclosure, and FIG. 2 is an exploded perspective view of FIG. 1. As shown in FIG. 1 and FIG. 2, the switching semiconductor device according to an embodiment of the present disclosure may comprise a semiconductor device 110, a first heat dissipation plate 200, and a second heat dissipation plate 300. The first heat dissipation plate 200 and the second heat dissipation plate 300 may be formed of a heat conducting member excellent in a heat transfer, respectively.

The semiconductor device 110 may be implemented as a so-called switching semiconductor device (hereinafter, referred to as a 'semiconductor device 110') capable of opening and closing a circuit without using contacts. The semiconductor device 110 may be provided with a cooling apparatus (heat dissipation plate or fin structure) so as to suppress an excessive increase in temperature during driving.

At least one plate surface of the semiconductor device 110 may be implemented as a flat surface 112 for heat exchange with the cooling apparatus (heat dissipation plate or fin structure). A cooling apparatus installation space (hereinafter referred to as 'installation space') for installing the cooling apparatus (heat dissipation plate or fin structure) may be formed at one side of the semiconductor device 110. For example, the installation space may be configured to have a predetermined distance along a thickness direction from the flat surface 112 of the semiconductor device 110.

The cooling apparatus may comprise the first heat dissipation plate 200 coupled to the flat surface 112 of the semiconductor device 110 and the second heat dissipation plate 300 coupled to the first heat dissipation plate 200 so as to allow heat exchange. The second heat dissipation plate 300 may be implemented so as to be disposed inside the installation space along a thickness direction of the first heat dissipation plate 200. Accordingly, a heat dissipation area of the semiconductor device 110 may be increased without increasing a size (volume) of the installation space. The heat dissipation area of the semiconductor device 110 may be increased by the first heat dissipation plate 200 and the second heat dissipation plate 300, and thus cooling performance may be increased without expanding the installation space.

A heat transfer material 120 called a thermal interface material (TIM) may be inserted into a contact region between the flat surface 112 of the semiconductor device 110 and the first heat dissipation plate 200. The heat transfer material 120 may reduce air (amount of air) present in the contact region between the flat surface 112 of the semiconductor device 110 and the first heat dissipation plate 200 to facilitate the heat transfer of the semiconductor device 110 and the first heat dissipation plate 200. For example, the heat transfer material 120 may comprise a thermal compound or a thermal grease.

The first heat dissipation plate 200 may comprise a contact surface 214 in contact with the flat surface 112 of the semiconductor device 110 to be formed in a plate shape, approximately. For example, the first heat dissipation plate 200 may be configured so as to cool down three semiconductor devices 110, simultaneously. The first heat dissipation plate 200 may comprise placing portions 212 on which three semiconductor devices 110 may be placed, respectively. The placing portion 212 may comprise the contact surface 214 in contact with the flat surface 112 of the semiconductor device 110. The placing portion 212 may comprise a sidewall portion 218 protruding from an edge of the contact surface 214. Fastening member insertion holes 216 may be respectively formed passing through the first heat dissipation plate 200 such that the semiconductor device 110 may be coupled by a fastening member 116. The fastening member insertion holes 216 of the first heat dissipation plate 200 may be formed at the placing portions 212, respectively. Fastening member insertion portions 114 may be formed passing through four corner regions of the semiconductor device 110 such that the fastening member 116 may be inserted thereinto. For example, the four fastening member insertion holes 216 may be formed at each placing portion 212 of the first heat dissipation plate 200 so as to be in communication with the fastening member insertion portions 114 of the semiconductor device 110, respectively.

The first heat dissipation plate 200 may comprise a plate-shaped first body 210 on which the contact surface 214 may be formed and a first heat dissipation fin 230 protruding in a thickness direction from a surface of the first body 210. The placing portions 212 may be formed at one plate surface of the first body 210, respectively. The first heat dissipation fins 230 may be formed protruding from an opposite surface of the placing portion 212 (contact surface 214) of both plate surfaces of the first body 210. A protrusion 220 protruding from a periphery may be provided at an opposite surface of the contact surface 214 of the both plate surfaces of the first body 210. The first heat dissipation fin 230 may be formed protruding from the protrusion 220.

The second heat dissipation plate 300 may be coupled to the first heat dissipation plate 200. The second heat dissipation plate 300 may comprise a plate-shaped second body 310. The second heat dissipation plate 300 may comprise a second heat dissipation fin 330 protruding from the second body 310. Sidewall portions 316 protruding in the vertical direction may be provided at both side surface portions of the second body 310.

In the present embodiment, a case in which the flat surface 112 is formed at one plate surface of the semiconductor device 110 and the first heat dissipation plate 200 is coupled to the flat surface 112 is illustrated, but this is only one embodiment, and the present embodiment is not limited thereto. The first heat dissipation plate 200 may be configured to be integrally formed at one plate surface of the semiconductor device 110. In this case, the first body 210 of the first heat dissipation plate 200 may be composed of the flat surface 112 of the semiconductor device 110, the first heat dissipation fin 230 may be formed protruding from the flat surface 112, and the second heat dissipation plate 300 may be configured to be coupled to the first heat dissipation fin 230.

The first heat dissipation plate 200 may be coupled to a base member 150. The base member 150 may be provided with a cooling fluid accommodation space 152 such that the first heat dissipation plate may be in contact with a cooling fluid (cooling water). In the present embodiment, the cooling fluid accommodation space 152 may form the installation space in which the first heat dissipation plate 200 is installed. The cooling fluid accommodation space 152 may be formed to be recessed in a thickness direction from one plate surface of the base member 150. The cooling fluid accommodation space 152 may be formed so as to be opened toward one side of the base member 150. The first heat dissipation plate 200 may be coupled so as to block an opening of the cooling fluid accommodation space 152 such that the first heat dissipation fin 230 may be inserted inside the cooling fluid accommodation space 152.

Here, although not shown in detail in drawings, a sealing material (sealing member, sealant and gasket) may be provided at a contact region between the base member 150 and the first heat dissipation plate 200 so as to prevent a leakage of the cooling fluid. The first body 210 of the first heat dissipation plate 200 may be configured to have an extended length and width compared to those of the cooling fluid accommodation space 152. Fastening member inserting portions 154 may be respectively formed at the base member 150 such that the fastening members 116 passing through the first heat dissipation plate 200 along the edge of the cooling fluid accommodation space 152 may be inserted and coupled, respectively. For example, the fastening member inserting portion 154 of the base member 150 may be configured to include a female screw portion such that a male screw portion of the fastening member 116 that has passed through the first heat dissipation plate 200 may be screwed.

Figure 3:
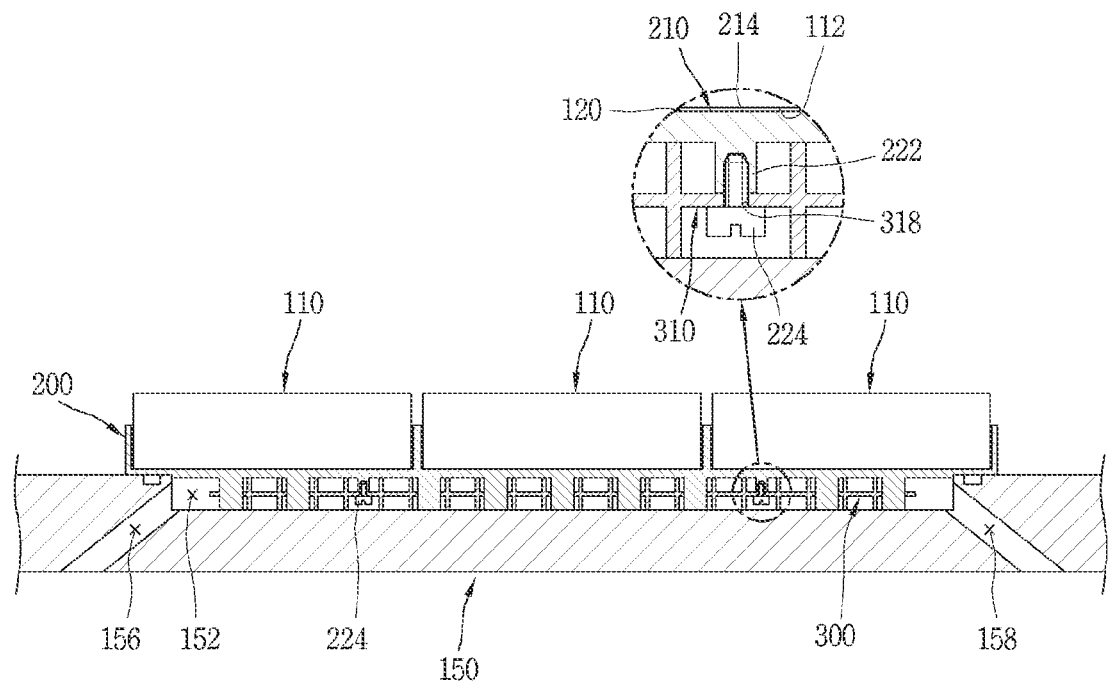
FIG. 3 is a cross-sectional view of a coupling state of a semiconductor device, a first heat dissipation plate, and a second heat dissipation plate of FIG. 1 according to an embodiment of the present disclosure.
Figure 4:
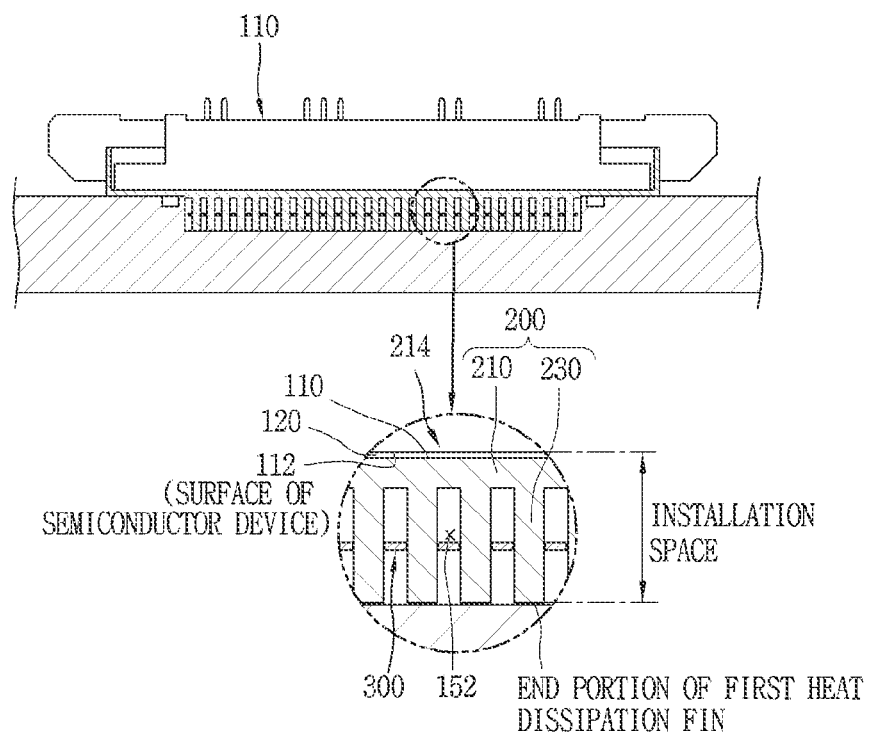
FIG. 4 is a cross-sectional view of FIG. 3 according to an embodiment of the present disclosure.

FIG. 3 is a cross-sectional view of a coupling state of the semiconductor device, the first heat dissipation plate, and the second heat dissipation plate of FIG. 1, and FIG. 4 is a cross-sectional view of FIG. 3. As shown in FIGS. 3 and 4, a cooling fluid inlet 156 may be formed at the base member 150 such that a cooling fluid may flow into the cooling fluid accommodation space 152. A cooling fluid outlet 158 may be formed at the other side of the cooling fluid accommodation space 152 such that the cooling fluid may flow out. The second heat dissipation plate 300 may be fastened to the first heat dissipation plate 200 by a fastening member 224. A boss portion 222 may be provided at the first heat dissipation plate 200 such that the fastening member 224 may be screwed. A fastening member insertion hole 318 may be formed passing through the second heat dissipation plate 300 such that the fastening member 224 may be inserted to correspond to the boss portion 222. The fastening member insertion hole 318 may be formed passing through a plate surface at a point corresponding to the boss portion 222 of the second body 310.

Figure 5:
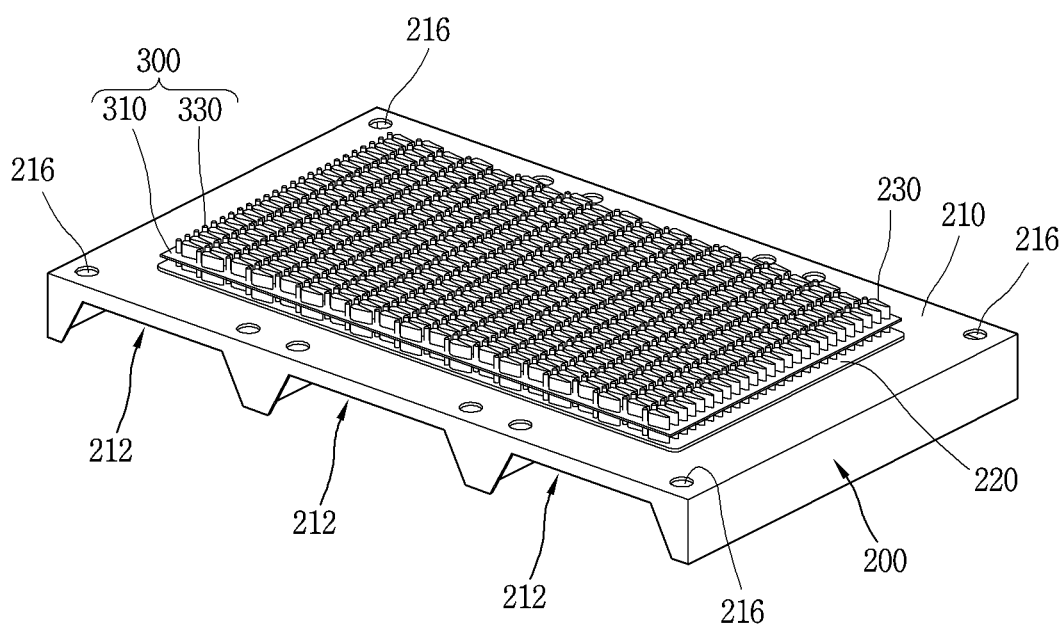
FIG. 5 is a perspective view of a coupling state of the first heat dissipation plate and the second heat dissipation plate of FIG. 2 according to an embodiment of the present disclosure.
Figure 6:
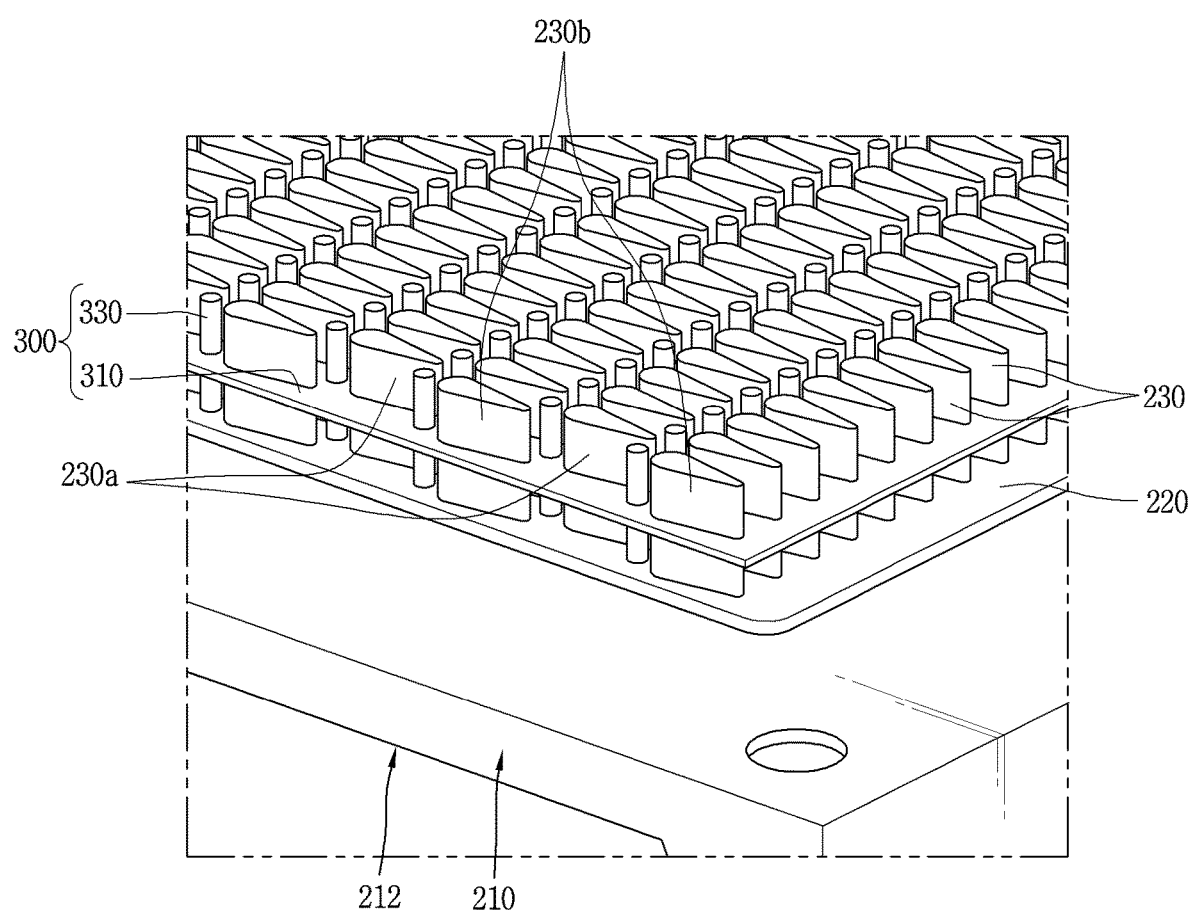
FIG. 6 is an enlarged view illustrating a main part of FIG. 5 according to an embodiment of the present disclosure.
Figure 7:
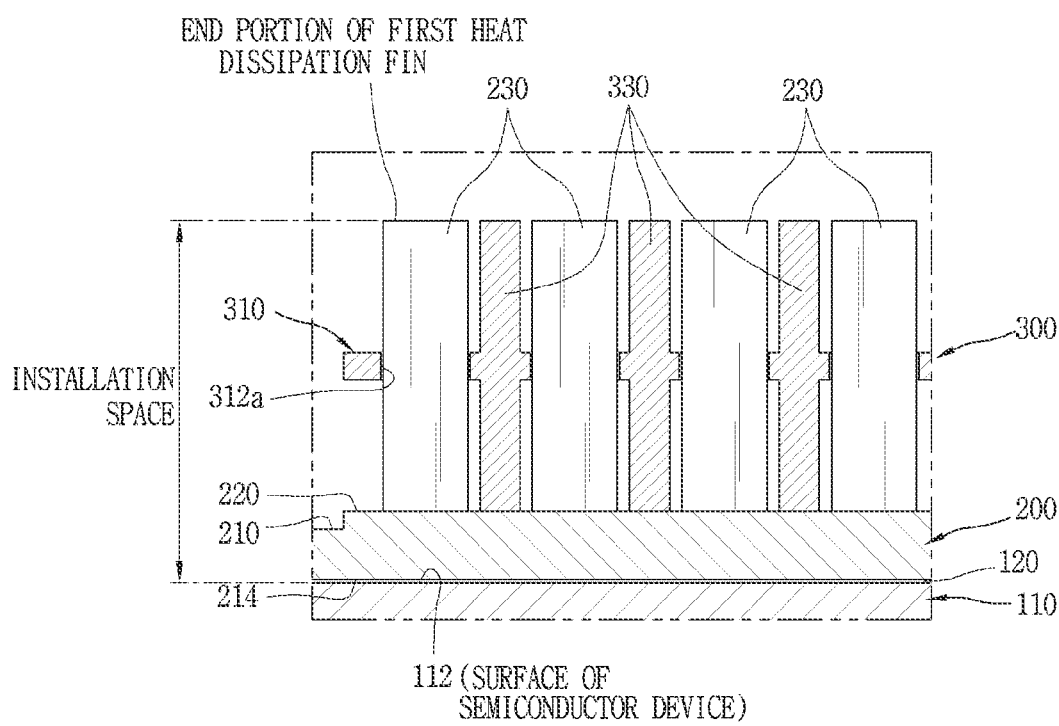
FIG. 7 is a cross-sectional view of a main part of FIG. 6 according to an embodiment of the present disclosure.
Figure 8:
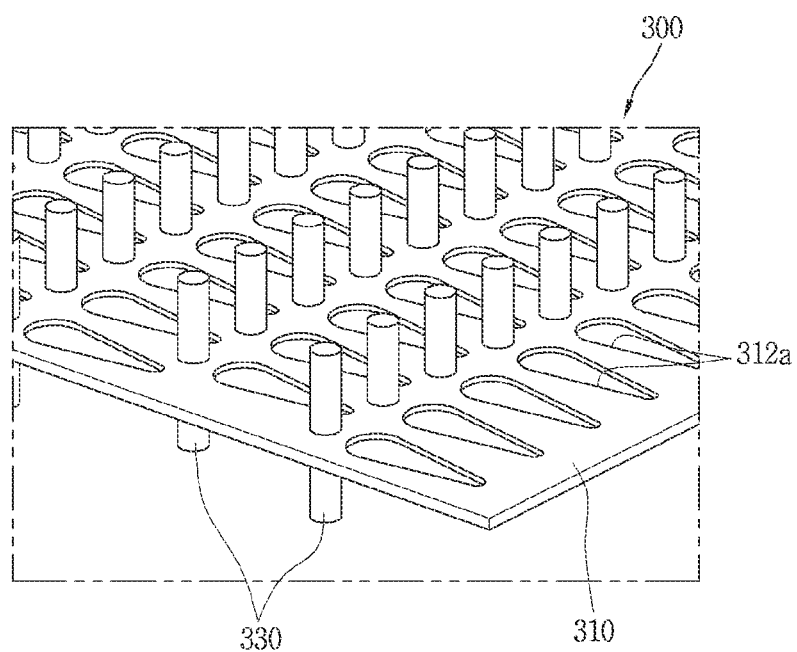
FIG. 8 is a perspective view of a main part in a separated state of the second heat dissipation plate of FIG. 2 according to an embodiment of the present disclosure.

FIG. 5 is a perspective view of a coupling state of the first heat dissipation plate and the second heat dissipation plate of FIG. 2, FIG. 6 is an enlarged view illustrating a main part of FIG. 5, FIG. 7 is a cross-sectional view of a main part of FIG. 6, and FIG. 8 is a perspective view of a main part in a separated state of the second heat dissipation plate of FIG. 2. As shown in FIGS. 5 and 6, the first heat dissipation fins 230 may be disposed so as to form a row along a width direction of the first heat dissipation plate 200. The first heat dissipation fins 230 may be formed so as to form a plurality of rows along a longitudinal direction of the first heat dissipation plate 200 (the first body 210). Odd rows 230a and even rows 230b of the first heat dissipation fins 230 may be configured to be alternately disposed from the cooling fluid inlet 156. The even rows 230b of the first heat dissipation fins 230 may be configured such that the first heat dissipation fins 230 of the odd rows 230a are respectively disposed therebetween along the width direction.

In the present embodiment, a case in which a number of the first heat dissipation fins 230 of the even row 230b is formed more than that of the odd row 230a along a moving direction of the cooling fluid is illustrated, but this is merely illustrative, and the number may be adjusted appropriately. The odd rows 230a and the even rows 230b of the first heat dissipation fins 230 may be configured to be spaced apart at a predetermined distance along the longitudinal direction of the first heat dissipation plate 200. For example, the first heat dissipation fins 230 may protrude in a pole shape from the surface of the first body 210 of the first heat dissipation plate 200. For example, the first heat dissipation fin 230 may be implemented to have a streamlined cross-section along a moving direction of the cooling fluid (cooling water). In the present embodiment, a case in which the first heat dissipation fins 230 are formed in a pole shape having a streamlined cross-section is illustrated, but this is merely illustrative, and the first heat dissipation fins 230 may be configured to have a cross-section of other planar figures (for example, circle, square, oval, etc.).

The second heat dissipation plate 300 may comprise a second body 310 having a plate shape and including a first heat dissipation fin hole 312a such that the first heat dissipation fin 230 may be inserted thereinto. The second heat dissipation plate 300 and the first heat dissipation plate 200 may be press-fitted to each other. The first heat dissipation fins 230 and the first heat dissipation fin holes 312a may be coupled with a predetermined fastener. Accordingly, the first heat dissipation fin 230 and the second heat dissipation plate 300 may be in close contact with each other, thereby facilitating heat transfer.

The second heat dissipation plate 300 may comprise a second heat dissipation fin 330 protruding from the second body 310. The second heat dissipation plate 300 may be configured to be spaced apart from the first body 210. Accordingly, since the second heat dissipation plate 300 is disposed at a relatively low temperature region to be spaced farther from the semiconductor device 110 which is a heat generating source, heat exchange of the second heat dissipation plate 300 may be further facilitated.

For example, as shown in FIGS. 7 and 8, the second heat dissipation fins 330 may be configured to protrude from both plate surfaces of the second body 310, respectively. The second heat dissipation fins 330 may be disposed in parallel with the first heat dissipation fins 230. The second heat dissipation fins 330 may be respectively disposed between the first heat dissipation fins 230 along the longitudinal direction of the first heat dissipation plate 200. The second heat dissipation fins 330 may be respectively disposed between rows of the first heat dissipation fins 230. The second heat dissipation fins 330 may be disposed to be spaced apart from each other on an extension line of the first heat dissipation fin 230 along the longitudinal direction of the first heat dissipation plate 200.

Figure 9:
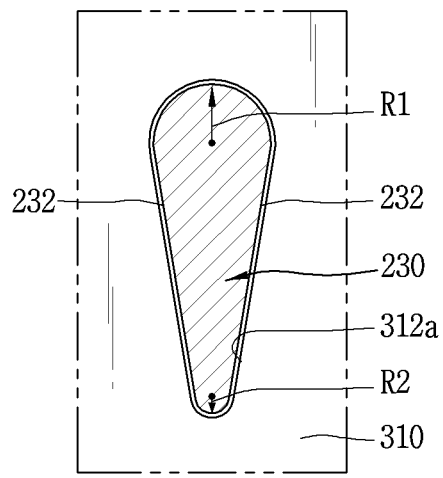
FIG. 9 is a cross-sectional view of a coupling state of the first heat dissipation fin of FIG. 2 according to an embodiment of the present disclosure.

FIG. 9 is a cross-sectional view of a coupling state of the first heat dissipation fin of FIG. 2. As shown in FIG. 9, for example, the first heat dissipation fin 230 may comprise both side surface portions 232 disposed converging to one side along a plate surface direction of the first body 210. Accordingly, flow resistance of the cooling fluid by the first heat dissipation fin 230 may be reduced. Both end portions of the first heat dissipation fin 230 may be implemented in a curved shape. Accordingly, the flow resistance of the cooling fluid by the first heat dissipation fin 230 may be further reduced. Both end portions of a cross section of the first heat dissipation fin 230 may have different curvature radii R1 and R2. The first heat dissipation fin hole 312a of the second heat dissipation plate 300 may have a cross-sectional shape corresponding to the cross-sectional shape of the first heat dissipation fin 230 so as to accommodate the first heat dissipation fin 230 therein. In the present embodiment, the first heat dissipation fin 230 may comprise a first end portion having a first curvature radius R1 and a second end portion having a second curvature radius R2 smaller than the first curvature radius R1. The first end portion of the first heat dissipation fin 230 may be disposed at an upstream side along a flow direction of the cooling fluid.

According to such a configuration, when the second heat dissipation plate 300 is to be coupled to the first heat dissipation plate 200, the first heat dissipation fin holes 312a of the second heat dissipation plate 300 may be disposed corresponding to the first heat dissipation fins 230 of the first heat dissipation plate 200, respectively, and the first heat dissipation plate 200 and the second heat dissipation plate 300 may be mutually pressed in a thickness direction such that the second heat dissipation plate 300 is press-fitted and coupled to the first heat dissipation plate 200. The fastening member 224 may be inserted into the fastening member insertion hole 318 of the second heat dissipation plate 300 to be screwed to the boss portion 222. Accordingly, the second heat dissipation plate 300 may be integrally coupled to the first heat dissipation plate 200.

When the coupling of the first heat dissipation plate 200 and the second heat dissipation plate 300 is completed, the first body 210 may be disposed at the base member 150 such that the first heat dissipation fins 230 of the first heat dissipation plate 200 and the second heat dissipation plate 300 may be inserted inside the cooling fluid accommodation space 152. The corresponding semiconductor devices 110 may be respectively placed at the corresponding placing portions 212 by interposing the heat transfer material 120 between each placing portion 212 of the first heat dissipation plate 200 and the semiconductor device 110. The fastening member 116 may be inserted into the fastening member insertion portion 114 of the semiconductor device 110 such that semiconductor device 110, the first heat dissipation plate 200, and the base member 150 are in close contact with each other.

Meanwhile, when the semiconductor device 110 is driven, a temperature of the semiconductor device 110 may be increased by a heat generating action. Heat generated from the semiconductor device 110 may be transferred to the first heat dissipation plate 200 in contact with the semiconductor device 110, and may be transferred to the second heat dissipation plate 300 coupled to the first heat dissipation plate 200. Accordingly, heat dissipation of the semiconductor device 110 may be facilitated.

A cooling fluid may be flowed into the cooling fluid accommodation space 152 of the base member 150 in order to cool down the semiconductor device 110. The cooling fluid flowed into the cooling fluid accommodation space 152 via the cooling fluid inlet 156 formed at one end portion of the cooling fluid accommodation space 152 may be moved to the other side of the cooling fluid accommodation space 152 while being in contact with the first heat dissipation fin 230 and the second heat dissipation plate 300 to exchange heat. The cooling fluid that is in contact with the first heat dissipation plate 200 and the second heat dissipation plate 300 respectively to cool down the first heat dissipation plate 200 and the second heat dissipation plate 300 may flow outside the base member 150 via the cooling fluid outlet 158. The cooling fluid that flowed out via the cooling fluid outlet 158 may be cooled down by a cooling fluid cooler (not shown). The cooling fluid cooled via the cooling fluid cooler to reduce the temperature may flow into the cooling fluid accommodation space 152 via the cooling fluid inlet 156 to repeatedly perform the process of cooling down the first heat dissipation plate 200 and the second heat dissipation plate. Accordingly, a temperature increase of the semiconductor device 110 may be suppressed, significantly.

Figure 10:
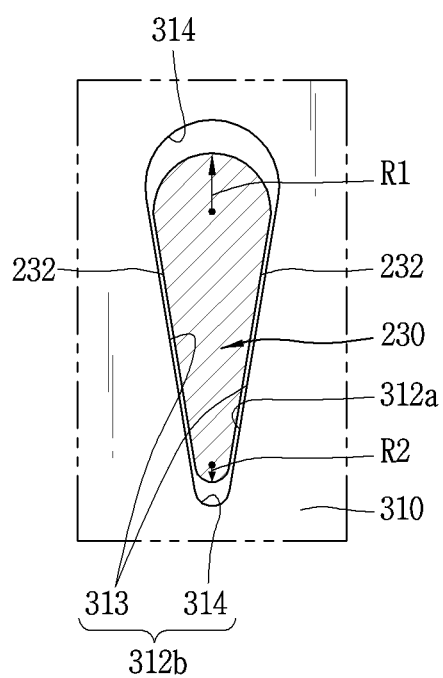
FIG. 10 is a modified example of the second heat dissipation plate of FIG. 2 according to an embodiment of the present disclosure.

Hereinafter, another embodiment of the present disclosure will be described with reference to FIGS. 10 to 23. FIG. 10 is a modified example of the second heat dissipation plate of FIG. 2. As shown in FIG. 10, the second heat dissipation plate 300 may comprise a first heat dissipation fin hole 312b comprising a contact section 313 in contact with the first heat dissipation fin 230 and a non-contact section 314 spaced apart from the first heat dissipation fin 230. The first heat dissipation fin hole 312b may comprise the contact section 313 in contact with both side portions 232 of the first heat dissipation fin 230. The first heat dissipation fin hole 312b may comprise the non-contact section 314 spaced apart from both end portions of the first heat dissipation fin 230.

In the present embodiment, a case in which the contact section 313 is formed to be in contact with the both side portions 232 of the first heat dissipation fin 230 and the non-contact section 314 is formed to be spaced apart from the both end portions of the first heat dissipation fin 230 is illustrated, but this is merely illustrative, and it may be possible that the contact section is formed to be in contact with the both end portions of the first heat dissipation fin 230 and the non-contact section is formed to be spaced apart from the both side portions 232 of the first heat dissipation fin 230.

According to such a configuration, the cooling fluid may be flowed via the non-contact section 314 along a thickness direction of the second body 310 of the second heat dissipation plate 300, and heat dissipation of the boundary region between the cooling fluid and the first heat dissipation fin 230 and the second body 310 may be further facilitated.

Figure 11:
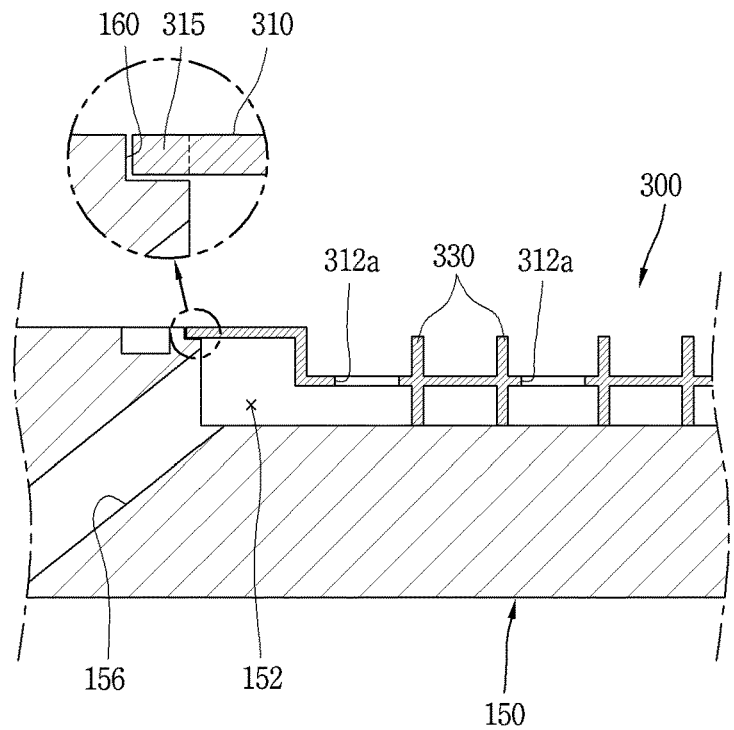
FIG. 11 is a modified example of the second heat dissipation plate of FIG. 2 according to an embodiment of the present disclosure.

FIG. 11 is a modified example of the second heat dissipation plate of FIG. 2. As shown in FIG. 11, the second body 310 of the second heat dissipation plate 300 may comprise an engaging part 315 extending longer than a width of the cooling fluid accommodation space 152. An engage holding part 160 may be formed at the base member 150 so as to engage and hold the engaging part 315. For example, the engage holding part 160 may be formed extending in a width direction in an opening region of the cooling fluid accommodation space 152, and being cut along a thickness direction so as to corresponding to the thickness of the engaging part 315. According to such a configuration, when the first heat dissipation plate 200 and the second heat dissipation plate 300 are coupled to each other, since the engaging part 315 may be present between the engage holding part 160 and an edge of the first heat dissipation plate 200, movement in the width direction and the thickness direction may be suppressed, and thus a coupling state may be maintained stably.

Figure 12:
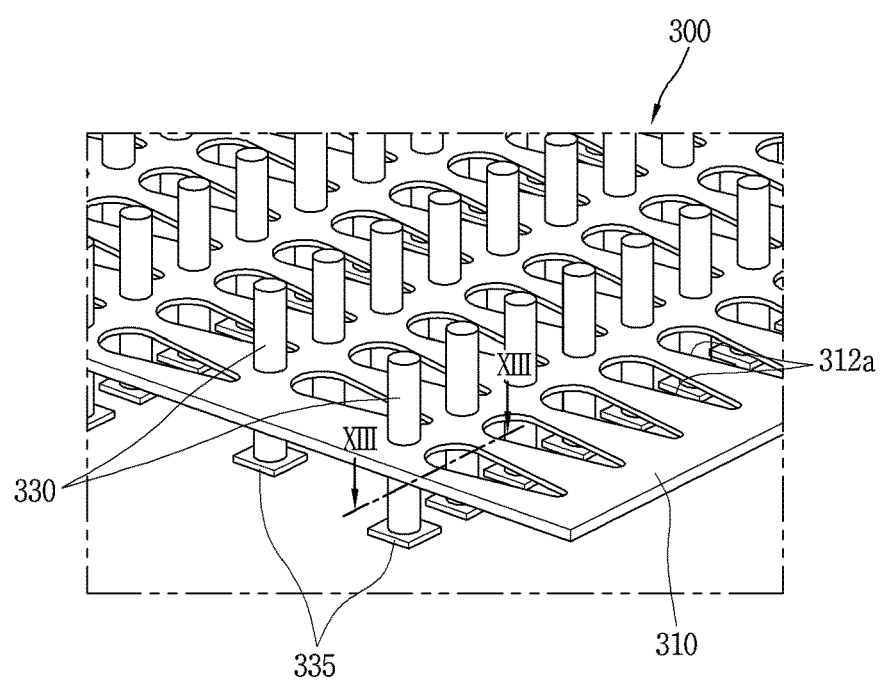
FIG. 12 is a perspective view of a main part of a second heat dissipation plate according to an embodiment of the present disclosure.
Figure 13:
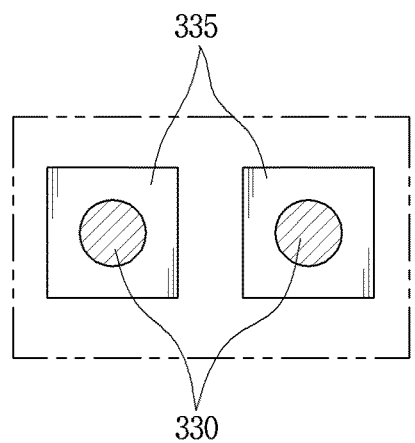
FIG. 13 is a cross-sectional view of the second heat dissipation fin of FIG. 12 according to an embodiment of the present disclosure.

FIG. 12 is a perspective view of a main part of a second heat dissipation plate according to still another embodiment of the present disclosure, and FIG. 13 is a cross-sectional view of the second heat dissipation fin of FIG. 12. As described above, a cooling apparatus for a switching semiconductor device of the present embodiment may comprise a first heat dissipation plate 200 provided to facilitate heat dissipation of a surface of a semiconductor device 110 at an installation space formed in a predetermined size at the surface of the semiconductor device 110, and a second heat dissipation plate 300 disposed inside the installation space along a thickness direction of the first heat dissipation plate 200 and in contact with the first heat dissipation plate 200 so as to allow heat exchange.

As shown in FIG. 12, the second heat dissipation plate 300 may comprise a second body 310 having a plate shape and including a first heat dissipation fin hole 312a such that the first heat dissipation fin 230 is inserted, and a second heat dissipation fin 330 protruding from the second body 310. The second heat dissipation fins 330 may protrude to both sides of the second body 310 along a thickness direction of the second body 310.

Meanwhile, the second heat dissipation plate 300 may comprise a first heat dissipation plate contact portion 335 in contact with the first heat dissipation plate 200 at the second heat dissipation fin 330. For example, the first heat dissipation plate contact portion 335 may be configured to be in contact with the first body 210. Accordingly, a contact area between the first heat dissipation plate 200 and the second heat dissipation plate 300 may be increased, and thus heat dissipation of the first heat dissipation plate 200 may be further facilitated.

For example, the first heat dissipation plate contact portion 335 may be formed in a quadrangular shape as shown in FIG. 13. The first heat dissipation plate contact portion 335 may be provided at an end portion of the second heat dissipation fin 330. Accordingly, heat energy of the first heat dissipation plate 200 may be rapidly transferred to the second heat dissipation fin 330, and thus cooling of the semiconductor device 110 may be facilitated. In the present embodiment, a case in which the first heat dissipation plate contact portion 335 is formed at each end portion of the second heat dissipation fin 330 is illustrated, but it may be formed at end portions of a plurality of second heat dissipation fins 330 simultaneously.

Figure 14:
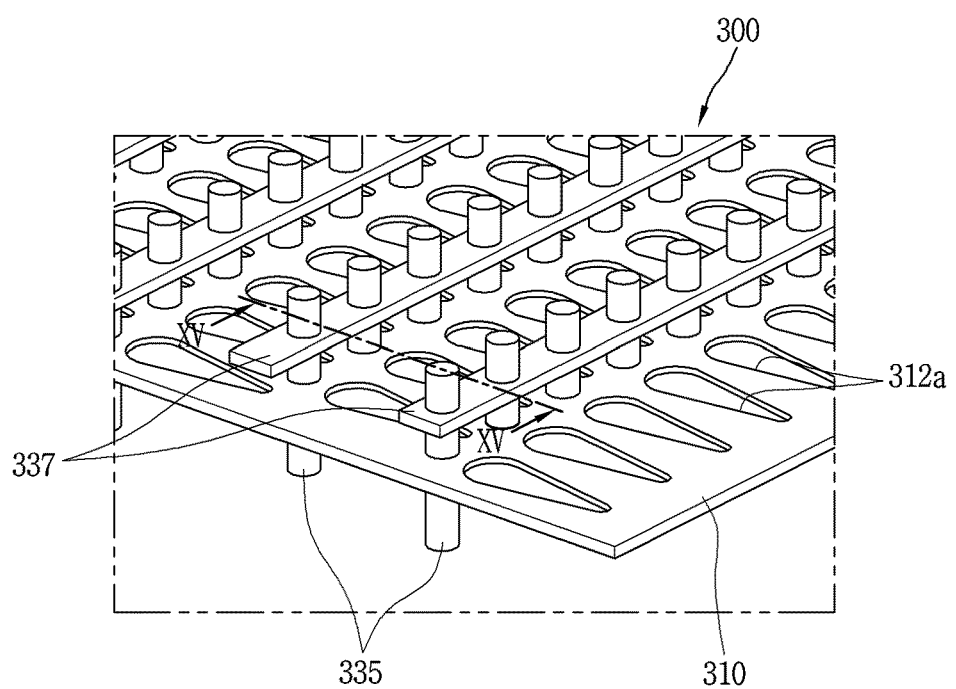
FIG. 14 is a perspective view of a main part of a second heat dissipation plate according to an embodiment of the present disclosure.
Figure 15:
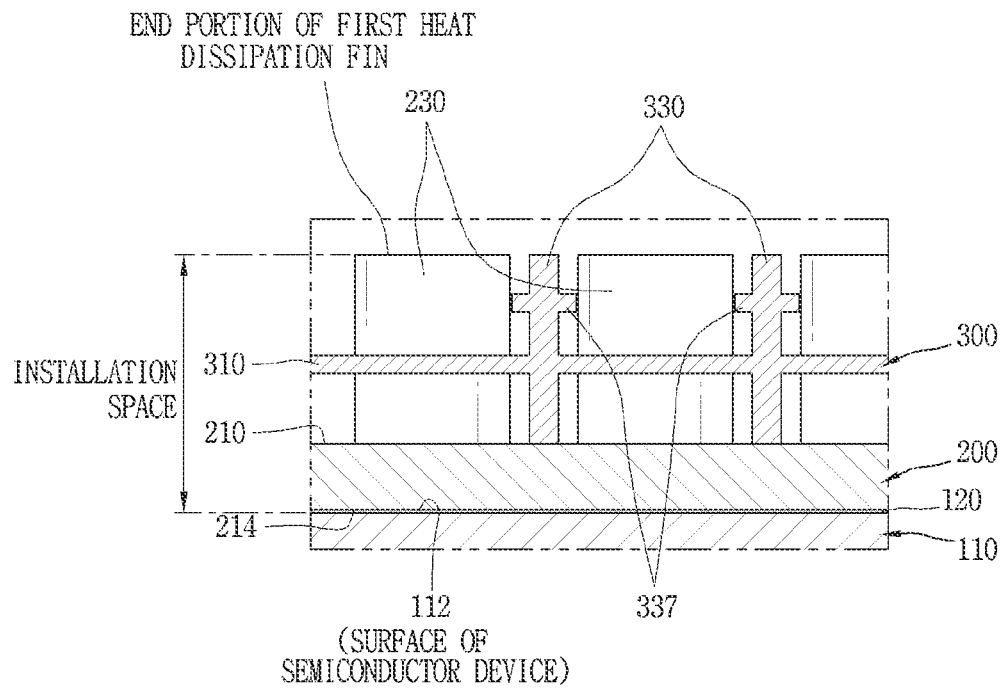
FIG. 15 is a cross-sectional view of the second heat dissipation fin of FIG. 14 according to an embodiment of the present disclosure.

FIG. 14 is a perspective view of a main part of a second heat dissipation plate according to still another embodiment of the present disclosure, and FIG. 15 is a cross-sectional view of the second heat dissipation fin of FIG. 14. As described above, a cooling apparatus of a switching semiconductor device of the present embodiment may comprise a first heat dissipation plate 200 provided so as to allow facilitating heat dissipation of a surface of the semiconductor device 110, and a second heat dissipation plate 300 in contact with the first heat dissipation plate 200 so as to allow heat exchange inside the installation space.

Meanwhile, the second heat dissipation plate 300 may comprise an extension portion 337 extending so as to increase a surface area of the second heat dissipation fin 330. Accordingly, cooling of the second heat dissipation plate 300 may be facilitated. For example, the extension portion 337 may be formed extending in a radial direction of the second heat dissipation fin 330 and extending along a column direction of the second heat dissipation fin 330. For example, the extension portion 337 may be formed in a long rectangular plate shape. As shown in FIG. 15, the extension portion 337 may have a width capable of being disposed between the first heat dissipation fins 230. In the present embodiment, a case in which the extension portion 337 extends in a radial direction of the second heat dissipation fin 330 and is formed in a long plate shape extending along the column direction is illustrated, but this is merely illustrative, and extension portions of a planar shape (for example, a circle, oval, or square, etc.) may be individually formed at a circumference of each of the second heat dissipation fins 330. In addition, the extension portion may be configured such that one extension portion may be formed at a plurality of second heat dissipation fins 330.

Figure 16:
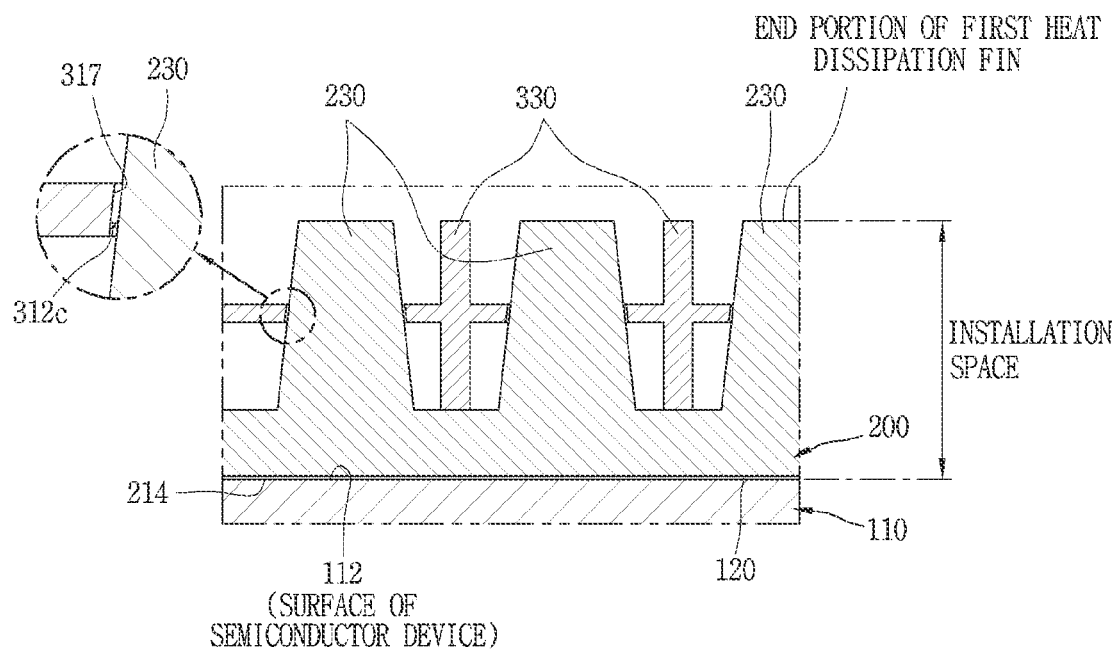
FIG. 16 is a cross-sectional view of a main part of a coupled state of a second heat dissipation plate according to an embodiment of the present disclosure.

FIG. 16 is a cross-sectional view of a main part of a coupled state of a second heat dissipation plate according to still another embodiment of the present disclosure. A cooling apparatus of a switching semiconductor device of the present embodiment may comprise a first heat dissipation plate 200 provided so as to allow facilitating heat dissipation of a surface of the semiconductor device 110, and a second heat dissipation plate 300 in contact with the first heat dissipation plate 200 so as to allow heat exchange inside the installation space.

For example, as shown in FIG. 16, the first heat dissipation fin 230 may be formed such that a cross-sectional area is reduced along a protruding direction. The second heat dissipation plate 300 may comprise a second body 310 including a first heat dissipation fin hole 312c so that the first heat dissipation fin 230 may be inserted and a second heat dissipation fin 330 protruding from the second body 310. The first heat dissipation fin hole 312c may comprise a sidewall surface 317 inclined to correspond to a side surface of the first heat dissipation fin 230. Accordingly, close contact of the first heat dissipation fin 230 and the inclined sidewall surface 317 of the first heat dissipation fin hole 312c may be facilitated, and thus heat transfer of the first heat dissipation fin 230 and the second heat dissipation plate 300 may be facilitated. Here, the first heat dissipation fin 230 and the inclined sidewall surface 317 of the first heat dissipation fin hole 312c may be configured to be press-fitted with a predetermined fastener. According to such a configuration, the first heat dissipation fin 230 and the second heat dissipation plate 300 may be in closer contact with each other, and thus heat transfer of the first heat dissipation fin 230 and the second heat dissipation plate 300 may be further facilitated.

Figure 17:
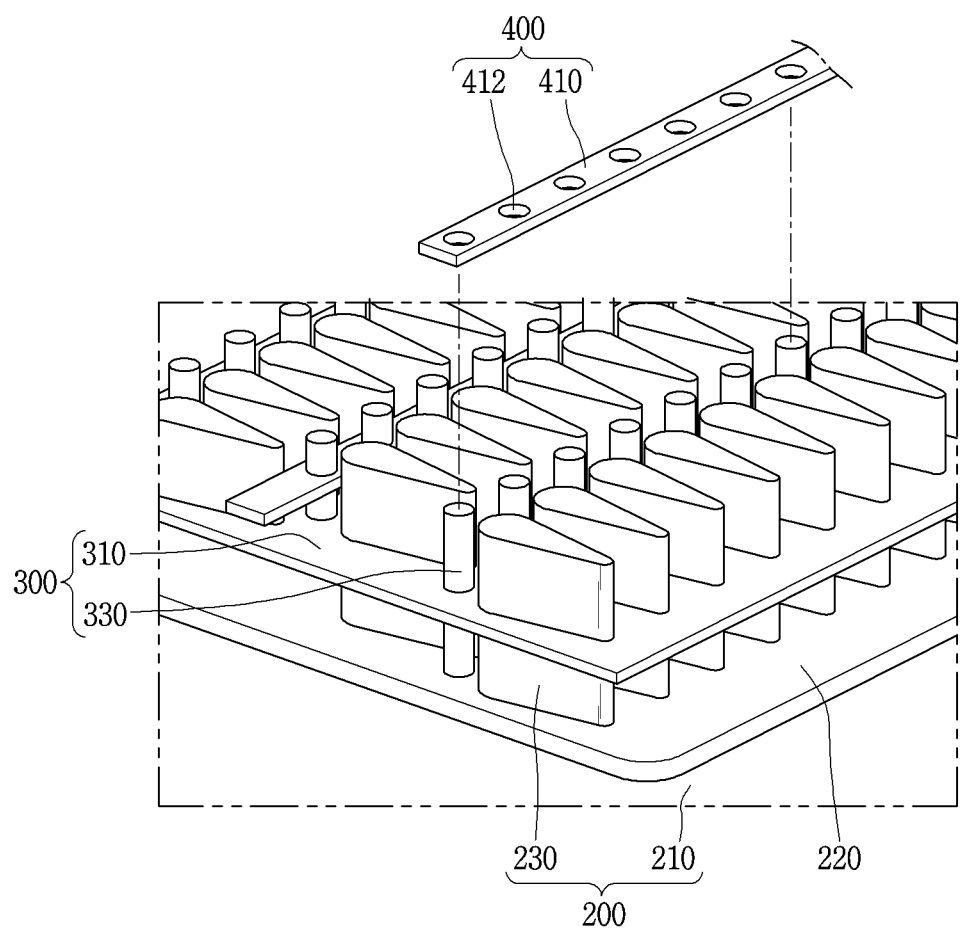
FIG. 17 is a perspective view of a main part of a separated state of a third heat dissipation plate according to an embodiment of the present disclosure.
Figure 18:
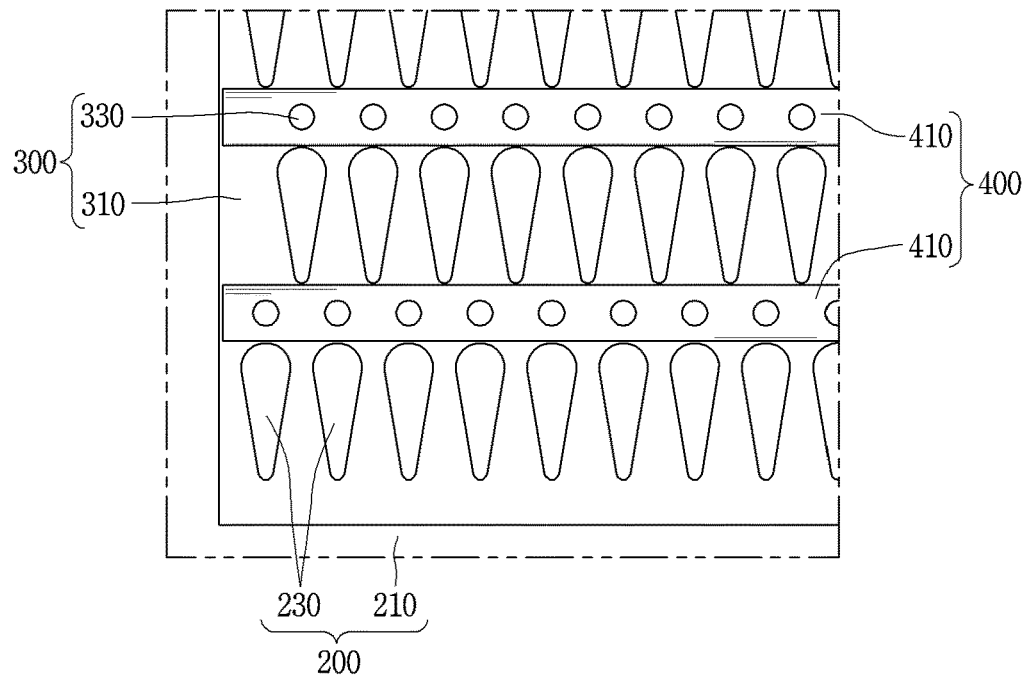
FIG. 18 is a plan view of a coupling state of the third heat dissipation plate of FIG. 17 according to an embodiment of the present disclosure.

FIG. 17 is a perspective view of a main part of a separated state of a third heat dissipation plate according to still another embodiment of the present disclosure, and FIG. 18 is a plan view of a coupling state of the third heat dissipation plate of FIG. 17. As shown in FIG. 17, a cooling apparatus of a switching semiconductor device of the present embodiment may comprise a first heat dissipation plate 200 provided so as to allow facilitating heat dissipation of a surface of the semiconductor device 110, a second heat dissipation plate 300 in contact with the first heat dissipation plate 200 so as to allow heat exchange inside the installation space, and a third heat dissipation plate 400 coupled to the first heat dissipation plate 200 and/or the second heat dissipation plate 300 inside the installation space.

The third heat dissipation plate 400 may comprise a plate-shaped third body 410 and a coupling hole 412 formed passing through the third body 410. For example, the third heat dissipation plate 400 may be configured to be coupled to the second heat dissipation fin 330. The coupling hole 412 may comprise a second heat dissipation fin hole 412a formed passing through such that the second heat dissipation fins 330 may be inserted into the third body 410. For example, the third body 410 may have a long plate shape and a plurality of second heat dissipation fin holes 412a formed passing through such that the second heat dissipation fins 330 forming a row may be coupled to the third body 410, simultaneously. As shown in FIG. 18, the third heat dissipation plate 400 may be configured to have a width capable of being disposed between the first heat dissipation fins 230. The third heat dissipation plate 400 may be disposed between odd rows 230a and even rows 230b of the first heat dissipation fins 230, respectively.

According to such a configuration, the second heat dissipation plate 300 may be coupled to the first heat dissipation fin 230, and the third heat dissipation plate 400 may be coupled to the second heat dissipation fin 330 of the second heat dissipation plate 300. When coupling of the first heat dissipation plate 200, the second heat dissipation plate 300, and the third heat dissipation plate 400 is completed, the first body 210 of the first heat dissipation plate 200 may be disposed so as to block an opening of a cooling fluid accommodation space 152 of the base member 150. After the semiconductor devices 110 are disposed at a placing portion 212 of the first body 210, respectively, the semiconductor device 110 and the first heat dissipation plate 200 may be integrally coupled to the base member 150 by using a fastening member.

Meanwhile, heat generated from the semiconductor device 110 by driving the semiconductor device 110 may be transferred to the first heat dissipation plate 200, the second heat dissipation plate 300, and the third heat dissipation plate 400, respectively. Accordingly, heat dissipation of the semiconductor device 110 may be facilitated, thereby rapidly reducing a temperature of the semiconductor device 110. When the semiconductor device 110 is driven, the cooling fluid may flow into the cooling fluid accommodation space 152 of the base member 150.

The cooling fluid that flowed into the cooling fluid accommodation space 152 may be in contact with the first heat dissipation plate 200, the second heat dissipation plate 300, and the third heat dissipation plate 400 to exchange heat, thereby respectively cooling down the first heat dissipation plate 200, the second heat dissipation plate 300, and the third heat dissipation plate 400. The cooling fluid heat-exchanged with the first heat dissipation plate 200, the second heat dissipation plate 300, and the third heat dissipation plate 400 may flow outside the cooling fluid accommodation space 152 and may cool down, and then a cooling function of the semiconductor device 110 may be performed while the process of flowing into the cooling fluid accommodation space 152 is repeated again.

Figure 19:
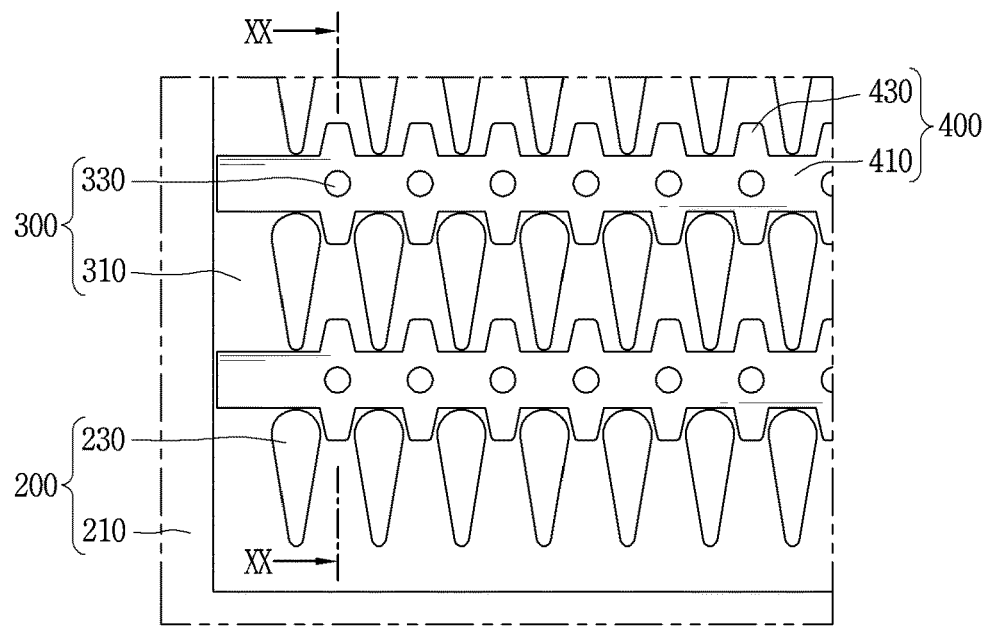
FIG. 19 is a plan view of a main part of a coupling state of a third heat dissipation plate according to an embodiment of the present disclosure.
Figure 20:
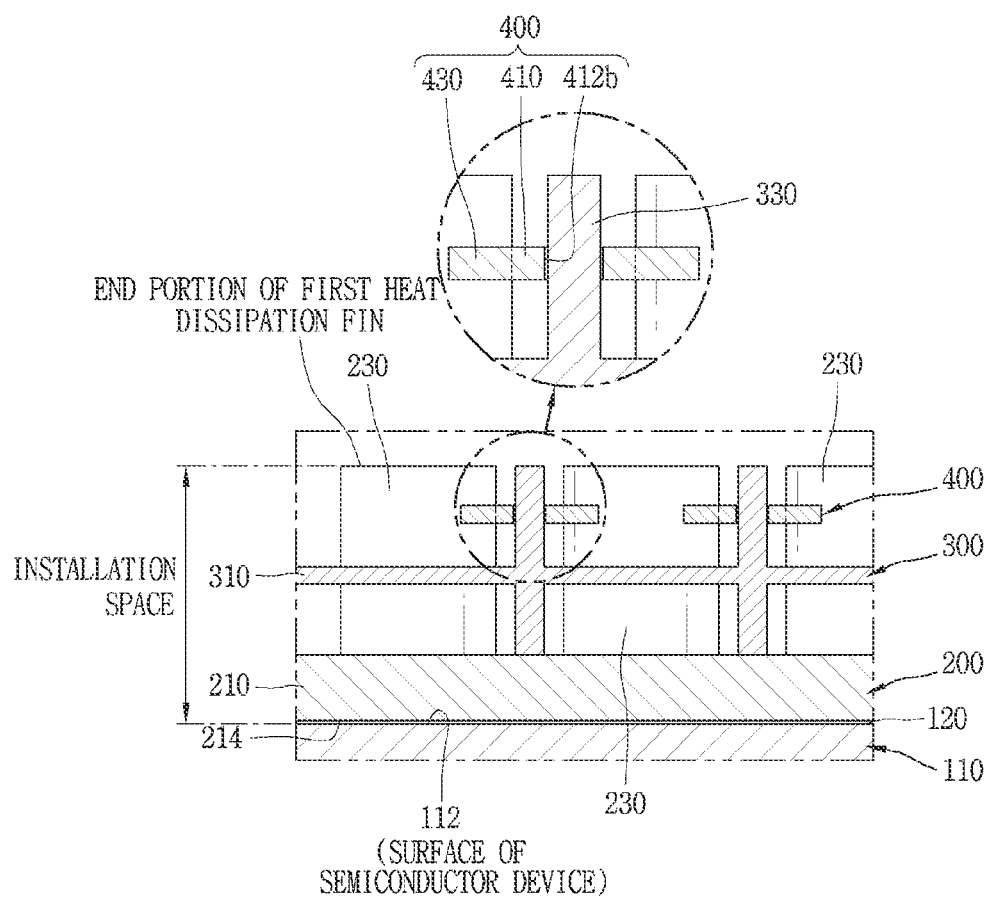
FIG. 20 is a cross-sectional view of a main part of FIG. 19 according to an embodiment of the present disclosure.

FIG. 19 is a plan view of a main part of a coupling state of a third heat dissipation plate according to still another embodiment of the present disclosure, and FIG. 20 is a cross-sectional view of a main part of FIG. 19. As shown in FIG. 19, a cooling apparatus of a switching semiconductor device of the present embodiment may comprise a first heat dissipation plate 200 provided so as to allow facilitating heat dissipation of a surface of the semiconductor device 110, a second heat dissipation plate 300 in contact with the first heat dissipation plate 200 so as to allow heat exchange inside the installation space, and a third heat dissipation plate 400 coupled to the first heat dissipation plate 200 and/or the second heat dissipation plate 300 inside the installation space.

The third heat dissipation plate 400 may comprise a plate-shaped third body 410 and a coupling hole 412 formed passing through the third body 410. For example, the third heat dissipation plate 400 may be coupled to the second heat dissipation plate 300. A second heat dissipation fin hole 412a may pass through the third body 410 such that the second heat dissipation fin 330 may be inserted into the third body 410.

Meanwhile, the third heat dissipation plate 400 may comprise a third heat dissipation fin 430 protruding from the third body 410. Accordingly, a heat dissipation area of the third heat dissipation plate 400 may be further increased. The third heat dissipation fin 430 may protrude along a plate surface direction of the third body 410. The third heat dissipation fins 430 may protrude outwardly along a width direction of the third body 410, respectively.

For example, as shown in FIG. 20, the third heat dissipation fins 430 may be parallel to a surface of the semiconductor device 110. The third heat dissipation fins 430 may protrude between the first heat dissipation fins 230, respectively. According to such a configuration, the heat dissipation area of the third heat dissipation plate 400 may be increased, thereby further cooling down the semiconductor device 110.

In addition, the third heat dissipation fins 430 may be respectively disposed at spaces between second end portions of the first heat dissipation fins 230, and thus occupancy of conductors (heat dissipation fins) may be increased, thereby improving heat exchange efficiency. In the present embodiment, a case in which the third heat dissipation fin 430 protrudes along a plate surface direction of the third body 410 is illustrated, but the third heat dissipation fins may protrude in a thickness direction of the third body 410.

Figure 21:
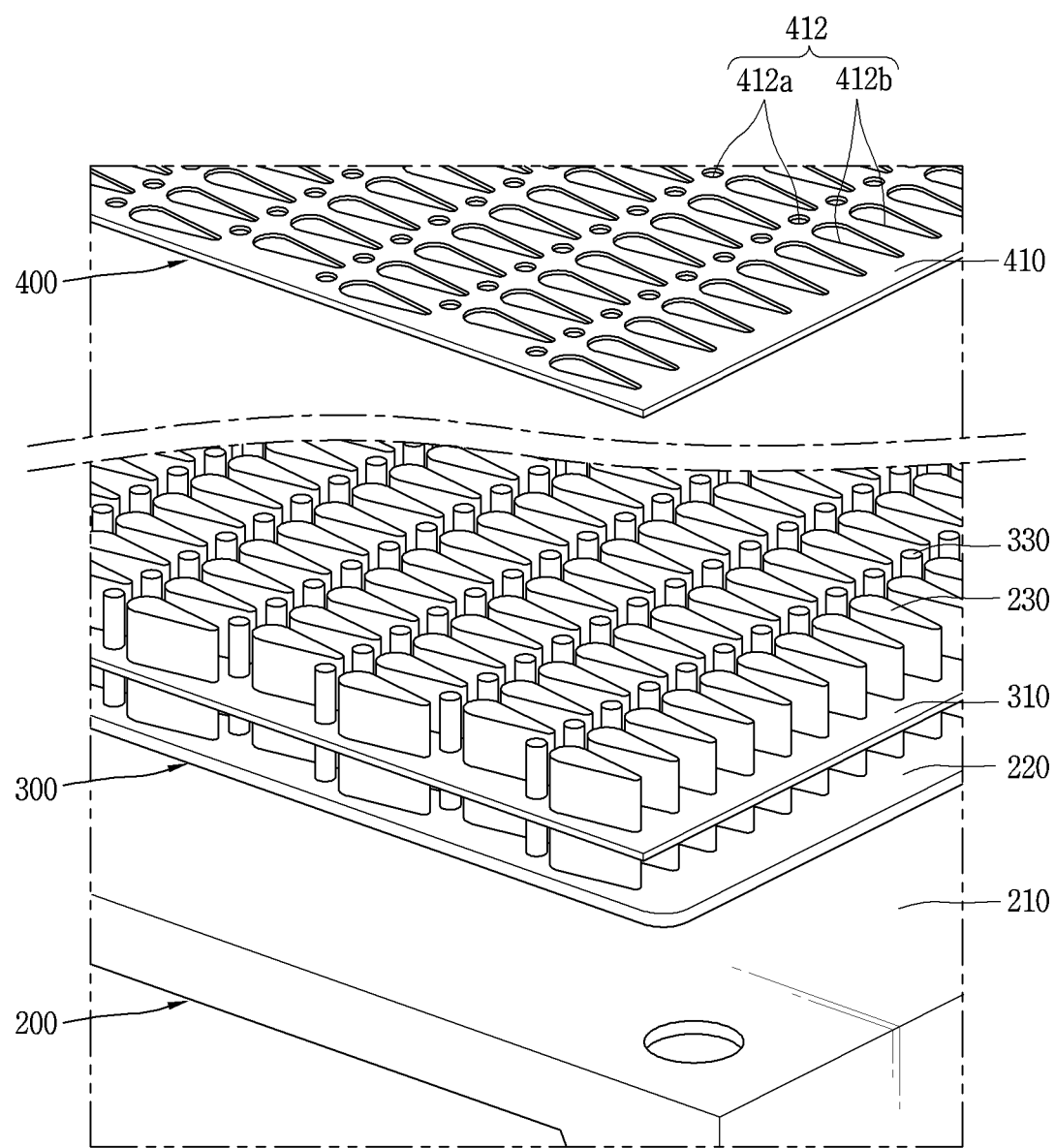
FIG. 21 is an exploded perspective view of a third heat dissipation plate according to an embodiment of the present disclosure.
Figure 22:
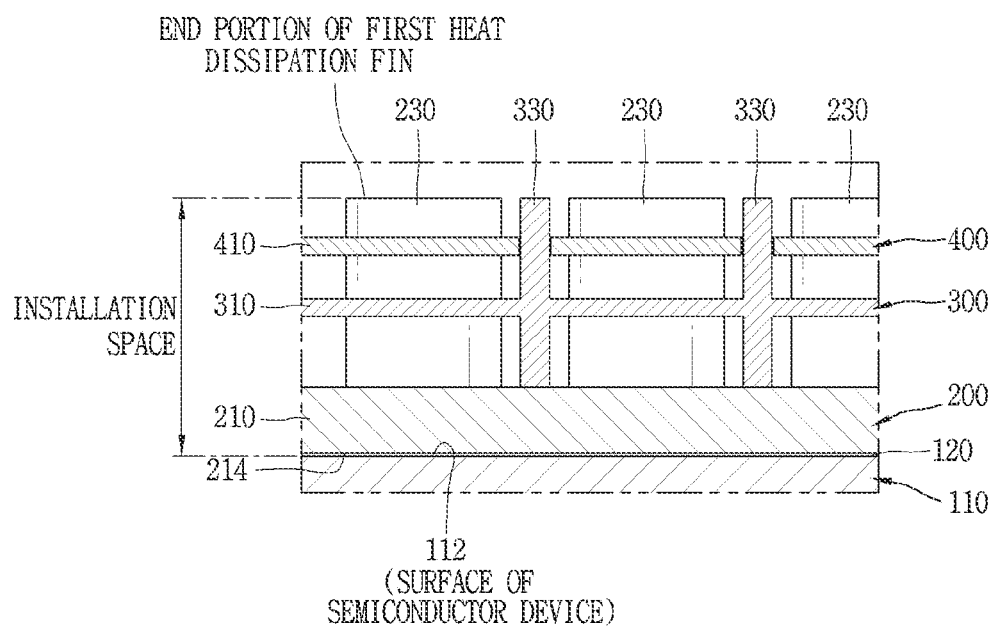
FIG. 22 is a cross-sectional view of a main part of a coupling state of the third heat dissipation plate of FIG. 21 according to an embodiment of the present disclosure.
Figure 23:
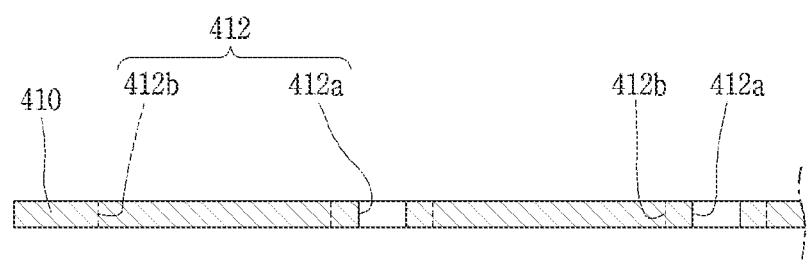
FIG. 23 is a cross-sectional view of the third heat dissipation plate of FIG. 21 according to an embodiment of the present disclosure.

FIG. 21 is an exploded perspective view of a third heat dissipation plate according to still another embodiment of the present disclosure, FIG. 22 is a cross-sectional view of a main part of a coupling state of the third heat dissipation plate of FIG. 21, and FIG. 23 is a cross-sectional view of the third heat dissipation plate of FIG. 21. As shown in FIG. 21, a cooling apparatus of a switching semiconductor device of the present embodiment may comprise a first heat dissipation plate 200 provided so as to allow facilitating heat dissipation of a surface of the semiconductor device 110, a second heat dissipation plate 300 in contact with the first heat dissipation plate 200 to be heat-exchanged inside the installation space, and a third heat dissipation plate 400 coupled to the first heat dissipation plate 200 or the second heat dissipation plate 300 inside the installation space.

For example, the third heat dissipation plate 400 may be coupled to the first heat dissipation plate 200 and the second heat dissipation plate 300, simultaneously. Accordingly, a heat dissipation area of the first heat dissipation fin 230 may be increased, thereby further increasing a heat dissipation speed of the first heat dissipation plate 200.

The third heat dissipation plate 400 may comprise a plate-shaped third body 410 and a coupling hole 412 formed passing through the third body 410. The third body 410 may be implemented in a rectangular plate shape that is substantially the same as the second body 310.

As shown in FIGS. 21 to 23, the coupling hole 412 may comprise a first heat dissipation fin hole 412b into which the first heat dissipation fin 230 may be inserted and a second heat dissipation fin hole 412a into which the second heat dissipation fin 330 may be inserted.

As shown in FIG. 22, the third body 410 may be spaced apart from the second body 310. Accordingly, the third body 410 may be spaced apart from the semiconductor device 110 which may be a heat generating source at a low temperature region in which a temperature is relatively low, and thus heat exchange of the third heat dissipation plate 400 may be further facilitated.

In the present embodiment, a case in which the first heat dissipation fin hole 412b and the second heat dissipation fin hole 412a are configured to be in contact with both the first heat dissipation fin 230 and the second heat dissipation fin 330 is illustrated, but a part of sections of the first heat dissipation fin hole 412b and/or the second heat dissipation fin hole 412a may be configured to be provided with non-contact sections spaced apart from outer surfaces of the first heat dissipation fin 230 and/or the second heat dissipation fin 330, respectively.

According to such a configuration, since heat energy transferred from the semiconductor device 110 to the first heat dissipation plate 200 may be transferred to the second heat dissipation plate 300 and the third heat dissipation plate 400, simultaneously, heat dissipation of the first heat dissipation plate 200 may be performed more quickly. Accordingly, since a temperature of the first heat dissipation plate 200 may be reduced more quickly, a temperature of the semiconductor device 110 may be reduced accordingly.

In addition, the second heat dissipation plate 300 may be disposed at a relatively low temperature region to be spaced far from the semiconductor device 110 which may be a heat generating source, and the third heat dissipation plate 400 may be spaced farther from the semiconductor device 110 at a lower temperature region than the second heat dissipation plate 300, thereby improving heat exchange efficiency significantly.

In the foregoing, exemplary embodiments of the present disclosure have been shown and described. However, the present disclosure may be embodied in various forms without departing from the spirit or essential characteristics thereof, and accordingly, it is intended that the embodiment described above not be limited by the detailed description provided herein.

Moreover, even if any embodiment is not specifically disclosed in the foregoing detailed description, it should be broadly construed within the scope of the technical spirit, as defined in the accompanying claims. Furthermore, all modifications and variations included within the technical scope of the claims and their equivalents should be covered by the accompanying claims.

What is claimed is:

1. A cooling apparatus of a switching semiconductor device, the cooling apparatus comprising:
a first heat dissipation plate configured to facilitate heat dissipation of a surface of the semiconductor device, the first heat dissipation plate disposed in an installation space for installing the cooling apparatus, wherein the installation space is configured to have a predetermined distance along a thickness direction from the surface of the semiconductor device;
a second heat dissipation plate disposed inside the installation space along a thickness direction of the first heat dissipation plate, wherein the second heat dissipation plate is in contact with the first heat dissipation plate so as to allow heat exchange; and a third heat dissipation plate coupled to the first heat dissipation plate or the second heat dissipation plate inside the installation space, wherein:

the first heat dissipation plate is coupled to the surface of the semiconductor device so as to allow heat exchange, the first heat dissipation plate comprises a first body having a shape of a plate, and a first heat dissipation fin protruding from a surface of the first body in a thickness direction, and the installation space extends from the surface of the semiconductor device to an end portion of the first heat dissipation fin along the thickness direction of the first body.

2. The cooling apparatus of claim 1, wherein:

the second heat dissipation plate comprises a second body having a shape of a plate and comprising a first heat dissipation fin hole, and the first heat dissipation fin is configured to be inserted into the first heat dissipation fin hole.

3. The cooling apparatus of claim 2, wherein the second body is spaced apart from the first body.

4. The cooling apparatus of claim 2, wherein the second heat dissipation plate further comprises a second heat dissipation fin protruding from the second body.

5. The cooling apparatus of claim 4, wherein the second heat dissipation plate comprises an extension portion configured to increase a surface area of the second heat dissipation fin.

6. The cooling apparatus of claim 2, wherein the first heat dissipation fin hole comprises a contact section configured to contact the first heat dissipation fin and a separation section spaced apart from the first heat dissipation fin.

7. The cooling apparatus of claim 2, wherein the first heat dissipation fin and the second body are press-fitted into each other.

8. The cooling apparatus of claim 2, further comprising:

a base member coupled to form a cooling fluid accommodation space between the base member and the first heat dissipation plate, wherein the first heat dissipation plate is configured to be inserted into the base member, wherein the second heat dissipation plate is disposed between the first heat dissipation plate and the base member, and wherein the second heat dissipation plate is configured to be pressurized by the base member and coupled to the first heat dissipation plate when the first heat dissipation plate and the base member are coupled to each other.

9. The cooling apparatus of claim 1, wherein a cross-sectional area of the first heat dissipation fin decreases along a protruding direction.

10. The cooling apparatus of claim 1, wherein first and second side portions of the first heat dissipation fin are configured to converge to one side along a plate surface direction of the plate-shaped first body.

11. The cooling apparatus of claim 10, wherein first and second end portions of the first heat dissipation fin are curved.

12. The cooling apparatus of claim 1, wherein the third heat dissipation plate comprises a third body having a shape of a plate and a coupling hole formed through the third body.

13. The cooling apparatus of claim 12, wherein the third heat dissipation plate further comprises a third heat dissipation fin protruding from the third body.

14. A switching semiconductor device, comprising:

a semiconductor device;

a first heat dissipation plate configured to facilitate heat dissipation of a surface of the semiconductor device, the first heat dissipation plate disposed in an installation space for installing a cooling apparatus, wherein the installation space is configured to have a predetermined distance along a thickness direction from the surface of the semiconductor device;

a second heat dissipation plate disposed inside the installation space along a thickness direction of the first heat dissipation plate, wherein the second heat dissipation plate is configured to contact the first heat dissipation plate so as to allow heat exchange; and a third heat dissipation plate coupled to the first heat dissipation plate or the second heat dissipation plate inside the installation space, wherein:

the first heat dissipation plate is coupled to the surface of the semiconductor device so as to allow heat exchange, the first heat dissipation plate comprises a first body having a shape of a plate, and a first heat dissipation fin protruding from a surface of the first body in a thickness direction, and the installation space extends from the surface of the semiconductor device to an end portion of the first heat dissipation fin along the thickness direction of the first body.

15. The switching semiconductor device of claim 14, wherein the second heat dissipation plate comprises a second body coupled to the first heat dissipation plate and a second heat dissipation fin protruding from the second body.

16. A switching semiconductor device, comprising:

a semiconductor device;

a first heat dissipation plate configured to facilitate heat dissipation of a surface of the semiconductor device, the first heat dissipation plate disposed in an installation space for installing a cooling apparatus, wherein the installation space is configured to have a predetermined distance along a thickness direction from the surface of the semiconductor device;

a second heat dissipation plate disposed inside the installation space along a thickness direction of the first heat dissipation plate, wherein the second heat dissipation plate is in contact with the first heat dissipation plate so as to allow heat exchange; and a third heat dissipation plate disposed inside the installation space along the thickness direction of the first heat dissipation plate, wherein the third heat dissipation plate is configured to contact the second heat dissipation plate so as to allow heat exchange, wherein:

the first heat dissipation plate is coupled to the surface of the semiconductor device so as to allow heat exchange, the first heat dissipation plate comprises a first body having a shape of a plate, and a first heat dissipation fin protruding from a surface of the first body in a thickness direction, and the installation space extends from the surface of the semiconductor device to an end portion of the first heat dissipation fin along the thickness direction of the first body.

17. The switching semiconductor device of claim 16, wherein the third heat dissipation plate comprises a third body coupled to the second heat dissipation plate and a third heat dissipation fin protruding from the third body along a plate surface direction of the third body.

\* \* \* \* \*